United States Patent
Huber

(10) Patent No.: US 9,412,422 B2
(45) Date of Patent: Aug. 9, 2016

(54) MEMORY DEVICE AND METHOD FOR PUTTING A MEMORY CELL INTO A STATE WITH A REDUCED LEAKAGE CURRENT CONSUMPTION

(71) Applicant: Infineon Technologies AG, Neubiberg (DE)

(72) Inventor: Peter Huber, Neubiberg (DE)

(73) Assignee: INFINEON TECHNOLOGIES AG, Neubiberg (DE)

( * ) Notice: Subject to any disclaimer, the term of this patent is extended or adjusted under 35 U.S.C. 154(b) by 92 days.

(21) Appl. No.: 14/338,396

(22) Filed: Jul. 23, 2014

(65) Prior Publication Data
US 2015/0029807 A1 Jan. 29, 2015

(30) Foreign Application Priority Data
Jul. 23, 2013 (DE) .......................... 10 2013 012 234

(51) Int. Cl.
| G11C 5/14 | (2006.01) |
|---|---|
| G11C 11/407 | (2006.01) |
| G11C 11/417 | (2006.01) |
| G11C 11/408 | (2006.01) |

(52) U.S. Cl.
CPC ............... *G11C 5/14* (2013.01); *G11C 11/407* (2013.01); *G11C 11/417* (2013.01); *G11C 11/4085* (2013.01)

(58) Field of Classification Search
CPC .... G11C 5/14; G11C 11/417; G11C 11/4085; G11C 11/4072
USPC .................................................. 365/226, 227
See application file for complete search history.

(56) References Cited

U.S. PATENT DOCUMENTS

| 6,307,805 | B1 * | 10/2001 | Andersen ................. G11C 8/08 257/E27.098 |
|---|---|---|---|
| 6,839,299 | B1 * | 1/2005 | Bhavnagarwala ... G11C 7/1045 365/185.16 |
| 7,110,317 | B2 | 9/2006 | Song et al. |
| 7,391,232 | B1 * | 6/2008 | Bose ...................... G06F 1/3203 326/33 |
| 9,025,404 | B1 * | 5/2015 | Signh ................... G11C 11/412 365/189.08 |
| 2003/0062948 | A1 * | 4/2003 | Notani .................... H02M 3/07 327/544 |
| 2003/0102904 | A1 * | 6/2003 | Mizuno .................. G11C 5/147 327/544 |
| 2004/0210728 | A1 * | 10/2004 | Flautner .............. G06F 12/0893 711/156 |
| 2005/0094474 | A1 * | 5/2005 | Deng ........................ G11C 5/14 365/229 |
| 2005/0128852 | A1 * | 6/2005 | Deng ........................ G11C 5/14 365/226 |
| 2007/0046352 | A1 * | 3/2007 | Wang ................. H03K 3/35625 327/218 |
| 2007/0081409 | A1 | 4/2007 | Wuu et al. |
| 2008/0151673 | A1 * | 6/2008 | Fallah .................. G11C 11/417 365/226 |
| 2008/0170458 | A1 * | 7/2008 | Haid ........................ G11C 5/14 365/227 |

(Continued)

*Primary Examiner* — Viet Q Nguyen
(74) *Attorney, Agent, or Firm* — Viering, Jentschura & Partner mbB

(57) ABSTRACT

In various embodiments, a memory device includes at least one memory cell and at least one virtual supply line coupled to the at least one memory cell. The memory device is designed in such a way that a voltage potential present on the virtual supply line is altered after an active access to the memory cell by virtue of a charge stored within the memory device during the active access being re-stored in such a way that a state of the memory cell with a reduced leakage current consumption is achieved.

13 Claims, 6 Drawing Sheets

(56) References Cited

U.S. PATENT DOCUMENTS

| | | | | |
|---|---|---|---|---|
| 2008/0266992 | A1* | 10/2008 | Terzioglu | G11C 7/1051 365/207 |
| 2009/0003113 | A1* | 1/2009 | Terzioglu | H03K 19/0016 365/226 |
| 2011/0149666 | A1* | 6/2011 | Chang | G11C 7/12 365/203 |
| 2012/0195135 | A1* | 8/2012 | Kawasumi | G11C 11/413 365/189.06 |
| 2012/0206989 | A1* | 8/2012 | Song | G11C 5/147 365/226 |
| 2012/0281458 | A1* | 11/2012 | Teman | G11C 11/412 365/156 |
| 2013/0107651 | A1* | 5/2013 | Singh | G11C 11/412 365/207 |
| 2013/0314977 | A1* | 11/2013 | Wang | G11C 11/412 365/156 |
| 2015/0092477 | A1* | 4/2015 | Chiou | G06F 1/26 365/154 |

* cited by examiner

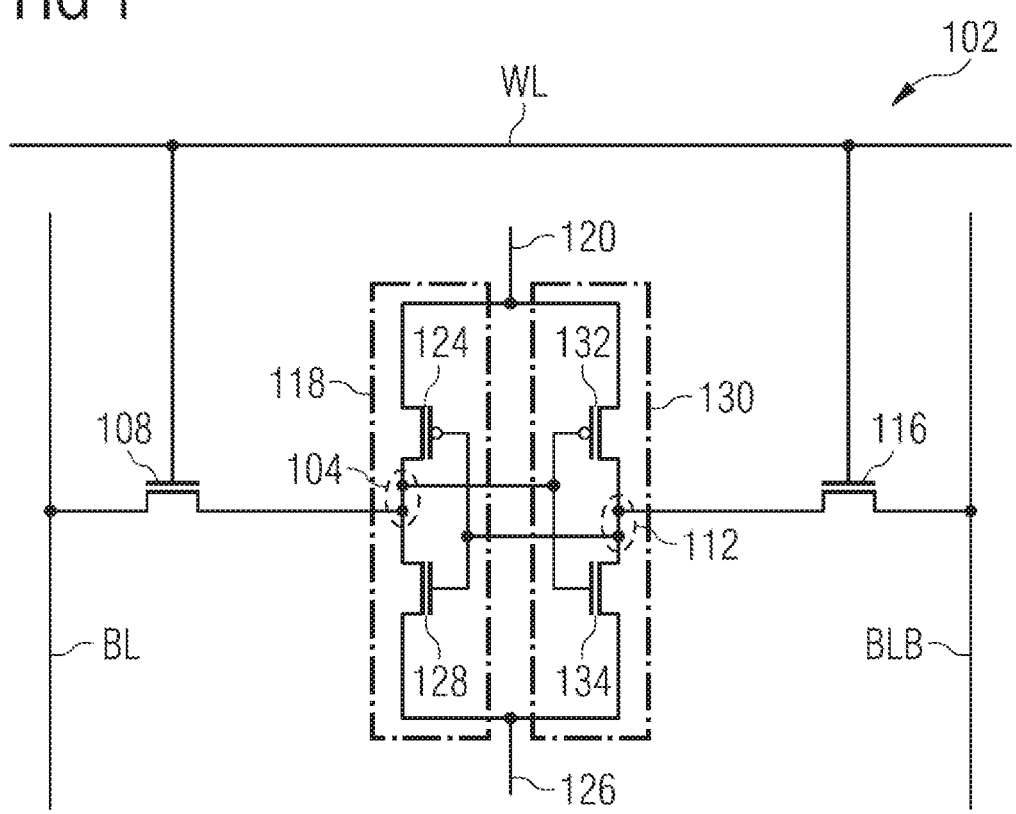

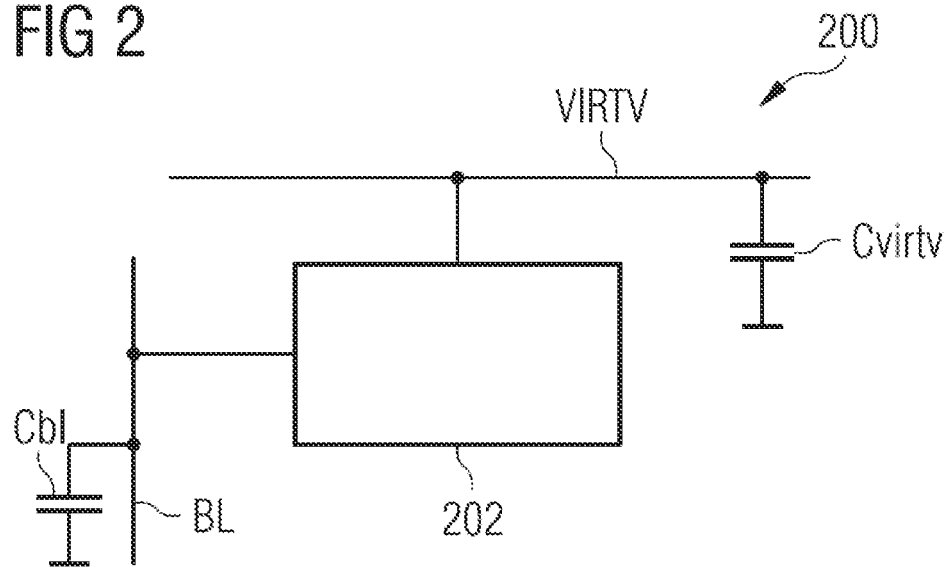
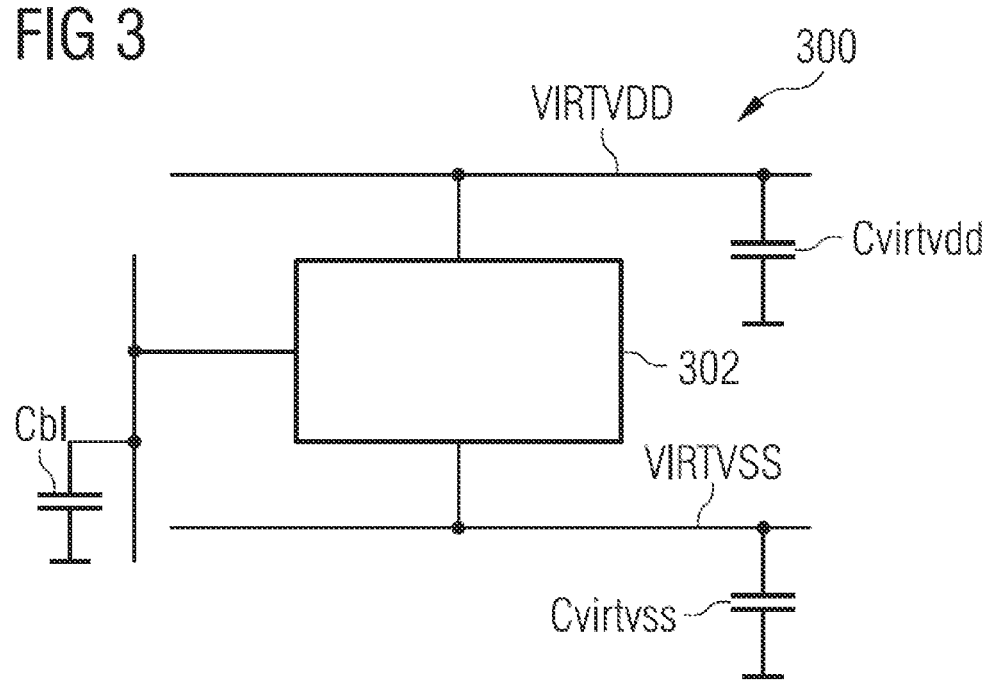

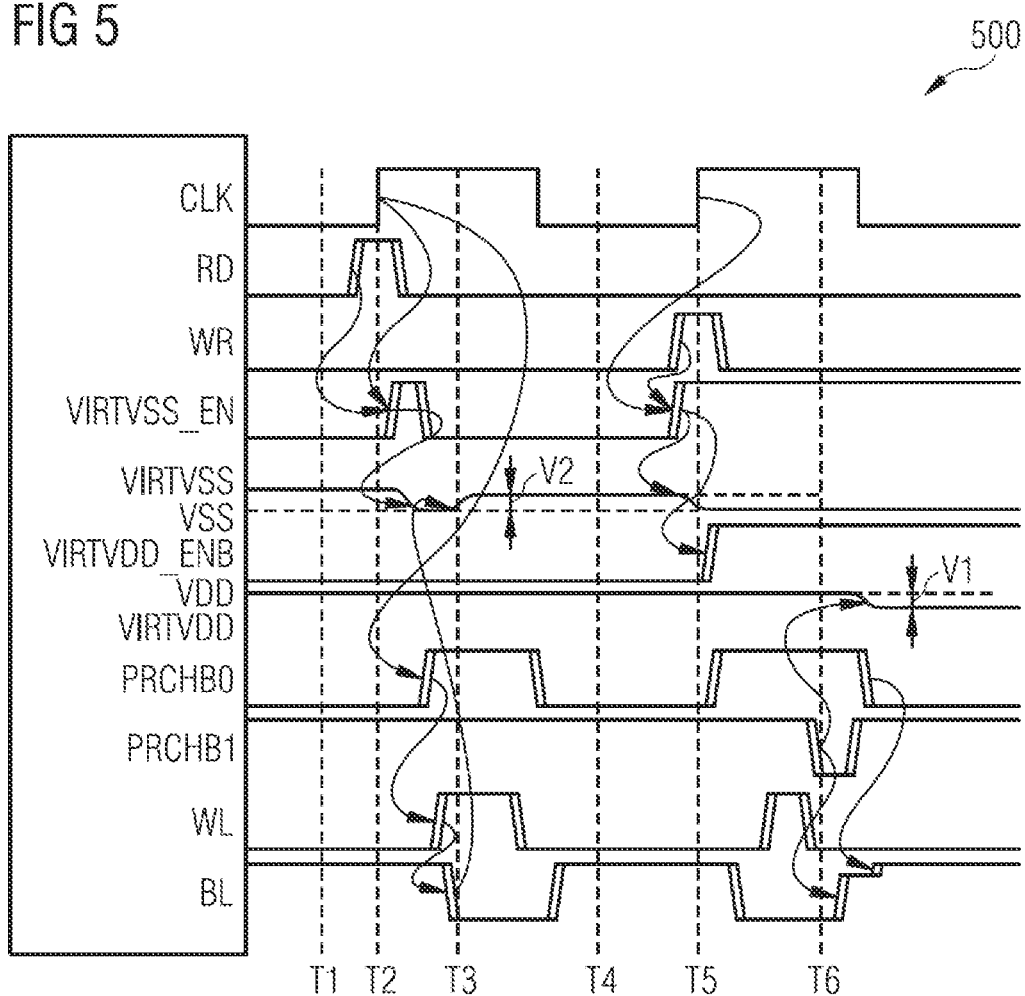

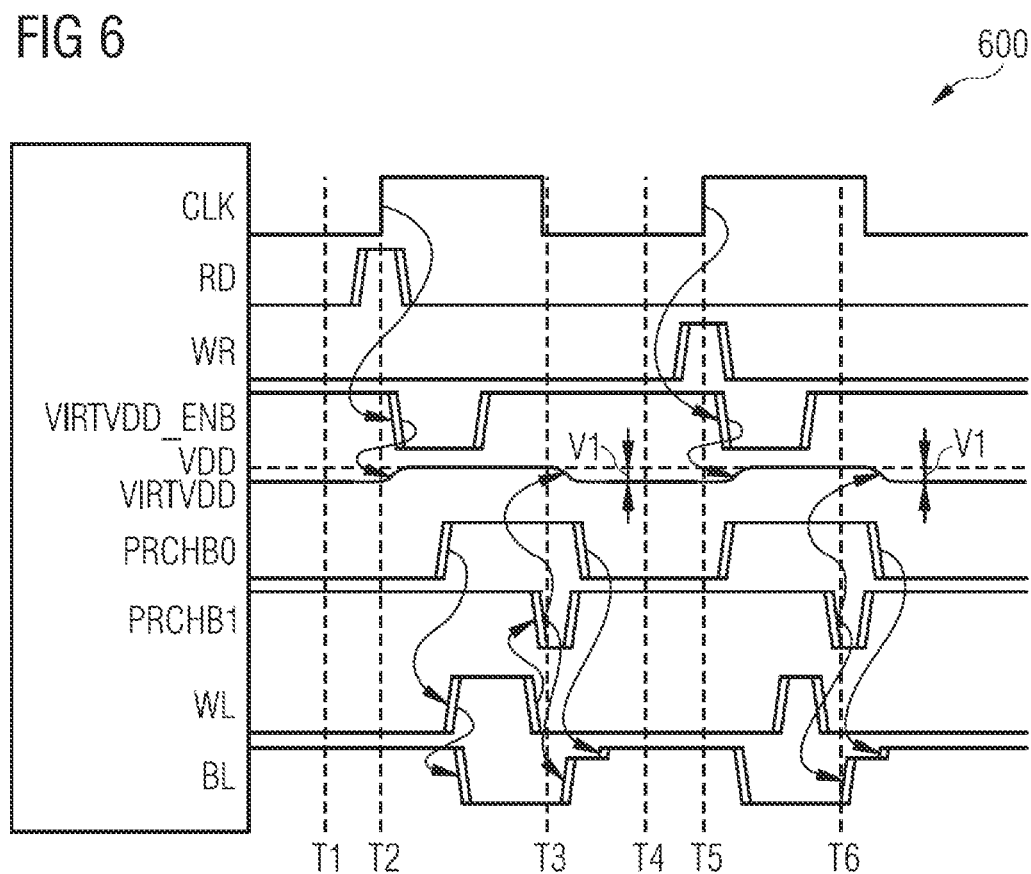

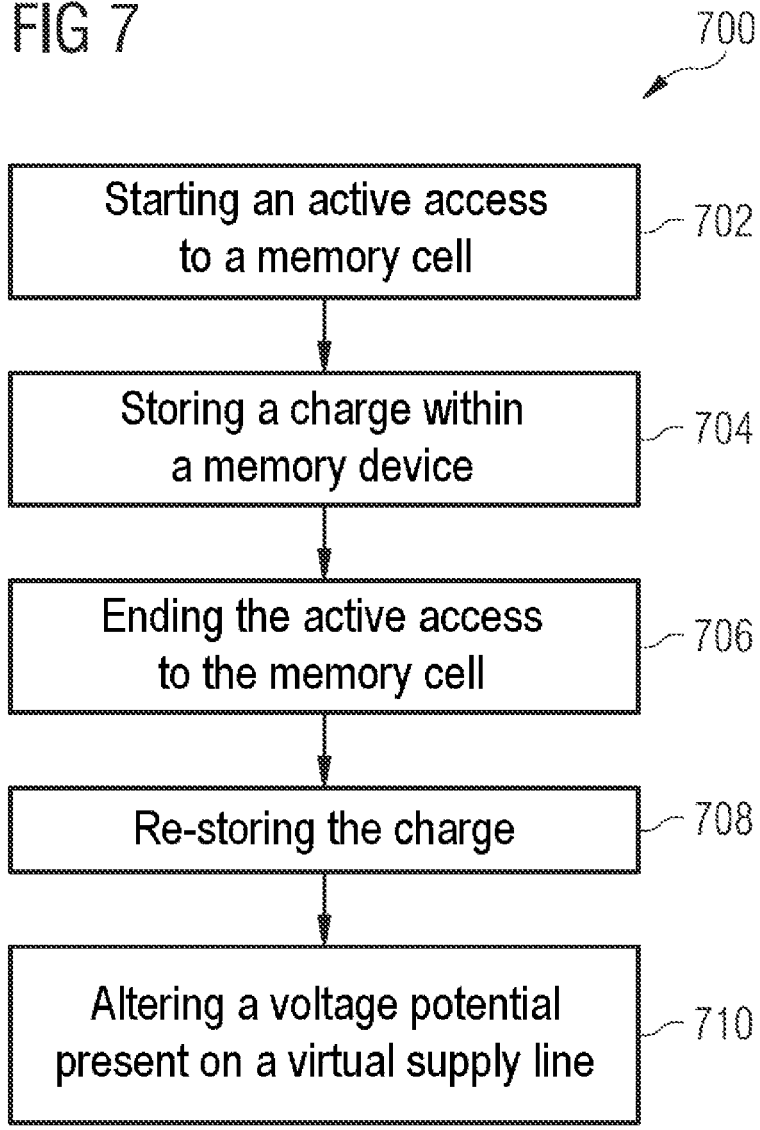

MEMORY DEVICE AND METHOD FOR PUTTING A MEMORY CELL INTO A STATE WITH A REDUCED LEAKAGE CURRENT CONSUMPTION

CROSS-REFERENCE TO RELATED APPLICATION

This application claims priority to German Patent Application Serial No. 10 2013 012 234.1, which was filed Jul. 23, 2013, and is incorporated herein by reference in its entirety.

TECHNICAL FIELD

Various embodiments relate generally to a memory device, and to a method for putting a memory cell into a state with a reduced leakage current consumption.

BACKGROUND

The power consumption of integrated semiconductor circuits is becoming increasingly important. One reason for this is the widespread use of integrated semiconductor circuits in mobile and portable devices which are operated with a battery and for which a long battery running time is a crucial selling criterion. Within the integrated semiconductor circuit, the area occupied by memory tends to increase more and more, and so the power consumption of memory is accorded a special importance.

In an integrated semiconductor circuit or in a memory, a distinction can be made between a dynamic and a static power loss. The dynamic power loss is caused, for example, by charge reversal of capacitances during switching processes. By contrast, the static power loss is caused, for example, by leakage currents flowing through an inactive transistor.

SUMMARY

In various embodiments, a memory device includes at least one memory cell and at least one virtual supply line coupled to the at least one memory cell. The memory device is designed in such a way that a voltage potential present on the virtual supply line is altered after an active access to the memory cell by virtue of a charge stored within the memory device during the active access being re-stored in such a way that a state of the memory cell with a reduced leakage current consumption is achieved.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which:

FIG. 1 shows a schematic illustration of one embodiment of a memory cell;

FIG. 2 shows a schematic illustration of one embodiment of a memory device;

FIG. 3 shows a schematic illustration of a further embodiment of a memory device;

FIG. 5 shows a signal timing diagram showing exemplary operations of the memory device illustrated and described in connection with FIG. 4;

FIG. 6 shows a signal timing diagram showing exemplary operations of a memory device derived from the memory device illustrated and described in connection with FIG. 4; and FIG. 7 shows a flow chart of a method.

DESCRIPTION

Figure 4:
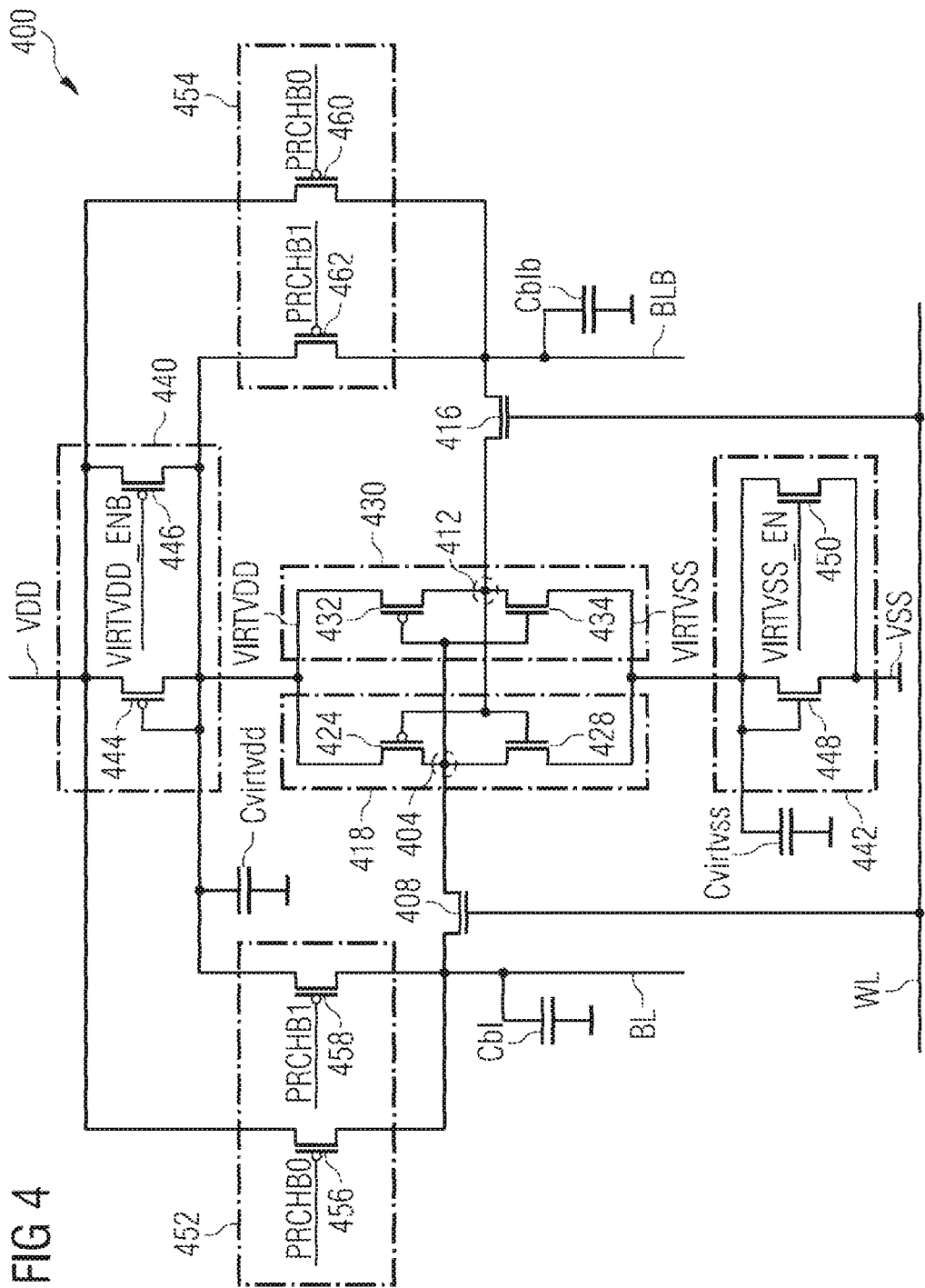
FIG. 4 shows a schematic illustration of a further embodiment of a memory device.

Various embodiments are explained in greater detail below, with reference to the accompanying figures. The numeral(s) furthest on the left in the reference signs identify the figure in which the reference sign is used for the first time. The use of identical or similar reference signs in the description and in the figures indicates identical or similar elements. The invention is not restricted to the embodiments specifically described, but rather can be suitably modified and altered. It lies within the scope of the invention to suitably combine individual features and feature combinations of one embodiment with features and feature combinations of another embodiment in order to arrive at further embodiments. In the context of the description and the patent claims, the terms "coupled" and "connected" relate both to direct and to indirect connections of circuit elements, i.e. also to connections through interposed circuits.

The following detailed description refers to the accompanying drawings that show, by way of illustration, specific details and embodiments in which the invention may be practiced.

The word "exemplary" is used herein to mean "serving as an example, instance, or illustration". Any embodiment or design described herein as "exemplary" is not necessarily to be construed as preferred or advantageous over other embodiments or designs.

The word "over" used with regards to a deposited material formed "over" a side or surface, may be used herein to mean that the deposited material may be formed "directly on", e.g. in direct contact with, the implied side or surface. The word "over" used with regards to a deposited material formed "over" a side or surface, may be used herein to mean that the deposited material may be formed "indirectly on" the implied side or surface with one or more additional layers being arranged between the implied side or surface and the deposited material.

Various embodiments may provide a memory device having a low power consumption.

In various embodiments, a memory device includes at least one memory cell and at least one virtual supply line coupled to the at least one memory cell. The memory device is designed in such a way that a voltage potential present on the virtual supply line is altered after an active access to the memory cell by virtue of a charge being re-stored. In this case, the charge stored within the memory device during the active access is re-stored in such a way that a state of the memory cell with a reduced leakage current consumption is achieved.

In various embodiments, a method for putting a memory cell into a state with a reduced leakage current consumption includes starting an active access to the memory cell. The method furthermore includes storing a charge within a memory device, wherein the memory device includes the memory cell. The method furthermore includes ending the active access to the memory cell, re-storing the charge and altering a voltage potential present on a virtual supply line, wherein the virtual supply line is coupled to the memory cell.

In one configuration of the memory device, the active access is a write access or a read access.

In one configuration of the memory device, re-storing the charge includes re-storing parasitic capacitances within the memory device.

In one configuration of the memory device, the voltage potential present on the virtual supply line is altered by virtue of a parasitic capacitance of the virtual supply line being charged or discharged.

One development of the memory device includes at least one bit line coupled to the at least one memory cell. Re-storing the charge includes charging or discharging a parasitic bit line capacitance of the at least one bit line.

In one configuration of the memory device, the active access is a write access or a read access. The voltage potential present on the virtual supply line is decreased by a first voltage magnitude after the write access or the read access by virtue of the parasitic bit line capacitance being charged by a charge stored in the parasitic capacitance of the virtual supply line during the write access or the read access.

In one configuration of the memory device, the voltage potential present on the virtual supply line includes a positive supply potential.

In one configuration of the memory device, the active access is a read access. The voltage potential present on the virtual supply line is increased by a second voltage magnitude after the read access by virtue of the parasitic capacitance of the virtual supply line being charged by a charge stored in the parasitic bit line capacitance during the read access.

In one configuration of the memory device, the voltage potential present on the virtual supply line includes a ground potential.

In one configuration of the memory device, the at least one virtual supply line includes a first virtual supply line and a second virtual supply line.

In one configuration of the memory device, the active access is a write access. The voltage potential present on the first virtual supply line is decreased by a first voltage magnitude after the write access by virtue of the parasitic bit line capacitance being charged by a charge stored in a parasitic capacitance of the first virtual supply line during the write access.

In one configuration of the memory device, the active access is a read access. The voltage potential present on the second virtual supply line is increased by a second voltage magnitude after the read access by virtue of a parasitic capacitance of the second virtual supply line being charged by a charge stored in the parasitic bit line capacitance during the read access.

One development of the memory device includes at least one supply line and at least one bias circuit, coupled to the virtual supply line and to the supply line in order, during the active access, to match a voltage potential present on the virtual supply line to a voltage potential present on the supply line.

In one configuration of the method, the active access is a write access or a read access.

In one configuration of the method, re-storing the charge includes re-storing parasitic capacitances within the memory device.

In one configuration of the method, re-storing the charge includes charging or discharging a parasitic bit line capacitance of a bit line. The bit line is coupled to the memory cell.

In one configuration of the method, altering the voltage potential present on the virtual supply line includes charging or discharging a parasitic capacitance of the virtual supply line.

In one configuration of the method the active access includes a write access or a read access. Storing the charge includes storing the charge in the parasitic capacitance of the virtual supply line, and re-storing the charge includes charging the parasitic bit line capacitance. Altering the voltage potential present on the virtual supply line includes decreasing by a first voltage magnitude.

In one configuration of the method, the active access is a read access. Storing the charge includes storing the charge in the parasitic bit line capacitance, and re-storing the charge includes charging the parasitic capacitance of the virtual supply line. Altering the voltage potential present on the virtual supply line includes increasing by a second voltage magnitude.

One development of the method includes starting a write access to the memory cell and storing a further charge in a further parasitic capacitance of a further virtual supply line. The method furthermore includes ending the write access to the memory cell and re-storing the further charge, wherein re-storing the further charge includes charging the parasitic bit line capacitance. The method furthermore includes decreasing a voltage potential present on the further virtual supply line by a first voltage magnitude.

FIG. 1 shows a schematic illustration of one embodiment of a memory cell. The memory cell 102 is a 6T SRAM cell. In FIG. 1, a first data node 104 is connected to a first bit line BL via a first access unit 108. The first access unit 108 is furthermore connected to a word line WL. A second data node 112 is connected to a second bit line BLB via a second access unit 116. The second access unit 116 is likewise connected to the word line WL.

The memory cell 102 stores mutually opposite data, i.e. the first data node 104 and the second data node 112 store complementary data. The first bit line BL and the second bit line BLB hold mutually complementary data, i.e. the first bit line BL and the second bit line BLB form a complementary bit line pair. The use of complementary bit line pairs enables a differential access to the content of the memory cell 102, i.e. to data stored in the first data node 104 and in the second data node 112. This allows the read-out of the memory cell 102, i.e. the detection of the complementary bit line pairs, even in the presence of noise or offset. Therefore, if the memory cell 102 is integrated in a system on chip, for example, it is possibly not sensitive to any noise in adjacent circuit elements.

The first access unit 108 is connected to the word line WL, the first bit line BL and the first data node 104. The first data node 104 is connected to the first bit line BL via the first access unit 108 as a reaction to a potential on the word line WL, in order to write data to the first data node 104 or to read data from the first data node 104. The second access unit 116 is connected to the word line WL, the second bit line BLB and the second data node 112. The second data node 112 is connected to the second bit line BLB via the second access unit 116 as a reaction to a potential on the word line WL, in order to write data to the second data node 112 or to read data from the second data node 112.

The memory cell 102 includes a pair of cross-coupled inverters connected in parallel between the first data node 104 and the second data node 112. The first inverter 118 of the pair of cross-coupled inverters includes a pull-up transistor 124, which is connected between a first supply line 120 and the first data node 104 and the gate of which is connected to the second data node 112. The first inverter 118 furthermore includes a pull-down transistor 128, which is connected between the first data node 104 and a second supply line 126 and the gate of which is connected to the second data node 112. The pull-up transistor 124 and the pull-down transistor 128 include series-connected terminals that define the first data node 104. The second inverter 130 of the pair of cross-coupled inverters includes a pull-up transistor 132, which is connected between the first supply line 120 and the second data node 112 and the gate of which is connected to the first data node 104. The second inverter 130 furthermore includes a pull-down transistor 134, which is connected between the second data node 112 and the second supply line 126 and the gate of which is connected to the first data node 104. The pull-up transistor 132 and the pull-down transistor 134 include series-connected terminals that define the second data node 112.

The pull-up transistors 124 and 132 can be embodied as PMOS transistors and the pull-down transistors 128 and 134 can be embodied as NMOS transistors. The transistors 124, 128, 132 and 134 can alternatively also be embodied as different types of transistors. Furthermore, the pair of cross-coupled inverters can contain not only transistors, rather the pull-up transistors 124 and 132 can be embodied as polysilicon load resistors, for example.

The first access unit 108 and the second access unit 116 can be embodied as transistors and the transistors can have the same conductivity type, e.g. NMOS transistors or PMOS transistors.

FIG. 2 shows a schematic illustration of one embodiment of a memory device. The memory device 200 includes a memory cell 202 and a virtual supply line VIRTV. The virtual supply line VIRTV is coupled to the memory cell 202 in order to connect the memory cell 202 to a voltage potential during operation.

During an active access to the memory cell 202, a specific voltage potential or a first voltage potential is present on the virtual supply line VIRTV. The memory device 200 is designed in such a way that a charge is stored within the memory device 200 during the active access to the memory cell 202. After the active access to the memory cell 202, the voltage potential present on the virtual supply line VIRTV is altered and a second voltage potential is present on the virtual supply line VIRTV. In this case, the voltage potential is altered by virtue of the charge stored during the active access being re-stored within the memory device 200. In this case, the voltage potential present on the virtual supply line VIRTV is altered after the active access in such a way that a state of the memory cell 202 with a reduced leakage current consumption is achieved.

After the active access to the memory cell 202 has ended and as long as a renewed access to the memory cell 202 does not yet take place, the memory cell 202 or the memory device 200 is in a state with low leakage current consumption. This state is designated as "sleep", for example. During a time period in which no access to the memory cell 202 takes place, the memory device 200 thus has a low static power loss and hence a low power consumption.

In one embodiment, the memory device 200 includes parasitic capacitances Cvirtv, Cbl. By way of example, the memory device 200 includes a first parasitic capacitance Cvirtv, Cbl and a second capacitance Cvirtv, Cbl. During the active access to the memory cell 202, the charge is stored within the memory device 200 by virtue of the first parasitic capacitance Cvirtv, Cbl of the memory device 200 being charged. Directly at the end of the active access or after the active access to the memory cell 200 the first parasitic capacitance Cvirtv, Cbl is discharged and the second parasitic capacitance Cvirtv, Cbl is charged with the charge of the first parasitic capacitance Cvirtv, Cbl.

Consequently, a process of re-storing the charge by transferring it from the first parasitic capacitance Cvirtv, Cbl to the second parasitic capacitance Cvirtv, Cbl takes place. This process of re-storing the charge brings about the alteration of the voltage potential present on the virtual supply line VIRTV in such a way that the leakage current consumption of the memory cell 202 is reduced.

In one embodiment, the first parasitic capacitance or the second parasitic capacitance is a parasitic capacitance Cvirtv of the virtual supply line VIRTV. The alteration of the voltage potential present on the virtual supply line VIRTV is brought about by a process of charging or discharging the parasitic capacitance Cvirtv of the virtual supply line VIRTV.

In one embodiment, the memory device 200 furthermore includes at least one bit line BL coupled to the memory cell 202. Via the bit line BL during operation a datum is written to the memory cell 202 or a datum is read from the memory cell 202. In various embodiments, the first parasitic capacitance or the second parasitic capacitance is a parasitic capacitance Cbl of the bit line BL. The alteration of the voltage potential present on the virtual supply line VIRTV is brought about by a process of charging or discharging the parasitic capacitance Cbl of the bit line BL.

In one example, the active access to the memory cell 202 is either a write access or a read access. During the active access, a charge is stored in the parasitic capacitance Cvirtv of the virtual supply line VIRTV. Directly at the end of or after the active access to the memory cell 202, the voltage potential present on the virtual supply line VIRTV is altered by virtue of the voltage potential being decreased by a first voltage magnitude. The decrease is brought about by the charge stored in the parasitic capacitance Cvirtv of the virtual supply line VIRTV being discharged and the parasitic bit line capacitance Cbl being charged with this charge. Consequently, after the active write or read access, a process of re-storing the charge from the parasitic capacitance Cvirtv of the virtual supply line VIRTV into the parasitic bit line capacitance Cbl takes place.

In a further example, the active access to the memory cell 202 is a read access. During the read access, a charge is stored in the parasitic bit line capacitance Cbl. Directly at the end or after the conclusion of the read access to the memory cell 202, the voltage potential present on the virtual supply line VIRTV is altered by virtue of the voltage potential being increased by a second voltage magnitude. The increase is brought about by the charge stored in the parasitic bit line capacitance Cbl being discharged and the parasitic capacitance Cvirtv of the virtual supply line VIRTV being charged with this charge. Consequently, after the active read access, a process of re-storing the charge from the parasitic bit line capacitance Cbl into the parasitic capacitance Cvirtv of the virtual supply line VIRTV takes place.

As described in connection with the two previous examples, the voltage potential present on the virtual supply line VIRTV after the active access is decreased by a first voltage magnitude or increased by a second voltage magnitude. The increase or the decrease is caused by charge being re-stored by being transferred between the parasitic bit line capacitance Cbl and the parasitic capacitance Cvirtv of the virtual supply line VIRTV. In this case, the first voltage magnitude can be equal to or different than the second voltage magnitude. The voltage increase or the voltage decrease on the virtual supply line VIRTV brings about a reduction of the leakage current consumption of transistors contained in the memory cell 202. The memory cell 202 thus has a reduced leakage current consumption and hence a reduced energy requirement.

The voltage potential present on the virtual supply line VIRTV includes, for example, a positive supply potential, a negative supply potential or a ground potential.

FIG. 3 shows a schematic illustration of a further embodiment of a memory device. In a manner similar to the memory device 200, illustrated and described with reference to FIG. 2, the memory device 300 includes a memory cell 302 and a bit line BL having a parasitic bit line capacitance Cbl coupled to the memory cell 302. Furthermore, the memory device 300 includes a first virtual supply line VIRTVDD having a parasitic capacitance Cvirtvdd and a second virtual supply line VIRTVSS having a parasitic capacitance Cvirtvss. In one embodiment, during operation a positive supply potential is present on the first virtual supply line VIRTVDD and a ground potential is present on the second virtual supply line VIRTVSS.

In a manner similar to that already illustrated and described further above with reference to FIG. 2, the memory device 300 is designed in such a way that a charge is stored within the memory device 300 during the active access to the memory cell 302. The charge is stored either in the parasitic capacitance Cvirtvdd of the first virtual supply line VIRTVDD, in the parasitic capacitance Cvirtvss of the second virtual supply line VIRTVSS or in the parasitic bit line capacitance Cbl. Directly at the end of or after the active access, charge reversal takes place between the capacitances Cvirtvdd, Cvirtvss, Cbl. In this case, a charge is re-stored by being transferred between the capacitances Cvirtvdd, Cvirtvss, Cbl in such a way that a state of the memory cell 302 with a reduced leakage current consumption is achieved.

In one example, the active access is a write access to the memory cell 302. During the write access, a charge is stored in the parasitic capacitance Cvirtvdd of the first supply line VIRTVDD. After the write access, the voltage potential present on the first supply line VIRTVDD is decreased by a first voltage magnitude. The decrease is brought about by the charge stored in the parasitic capacitance Cvirtvdd of the first supply line VIRTVDD being discharged and the parasitic bit line capacitance Cbl being charged with this charge.

In a further example, the active access is a read access to the memory cell 302. During the read access, a charge is stored in the parasitic bit line capacitance Cbl. After the read access, the voltage potential present on the second supply line VIRTVSS is increased by a second voltage magnitude. The increase is effected on the basis of the charge stored in the parasitic bit line capacitance Cbl being discharged and the parasitic capacitance Cvirtvss of the second supply line VIRTVSS being subsequently or simultaneously charged with this charge.

In one embodiment, the memory cells 202, 302 illustrated and described with reference to FIG. 2 and FIG. 3 include a 6T SRAM cell 102, as illustrated and described with reference to FIG. 1. The virtual supply line VIRTV of the memory cell 202 from FIG. 2 is coupled, for example, to the first supply line 120 or the second supply line 126 from FIG. 1. The first virtual supply line VIRTVDD of the memory cell 302 from FIG. 3 is coupled, for example, to the first supply line 120 from FIG. 1 and the second virtual supply line VIRTVSS of the memory cell 302 from FIG. 3 is coupled, for example, to the second supply line 126 from FIG. 1. In other embodiments, the memory cells 202, 302 include a different type of memory cell, such as, for example, an 8T SRAM cell, a 10T SRAM cell, a static memory cell having an arbitrary number of transistors with a differential access scheme, or a latch-based cell. This likewise applies to the embodiments described below.

FIG. 4 shows a schematic illustration of a further embodiment of a memory device. The memory device 400 includes a 6T SRAM cell as memory cell as illustrated and described with reference to FIG. 1. The memory cell includes a first data node 404 and a second data node 412, in which mutually complementary data are stored. The memory cell furthermore includes a first access unit 408 and a second access unit 416. A first terminal of the first access unit 408 is coupled to the first data node 404 and a second terminal of the first access unit 408 is coupled to a bit line BL. A control terminal of the first access unit 408 is coupled to a word line WL. A first terminal of the second access unit 416 is coupled to the second data node 412 and a second terminal of the second access unit 416 is coupled to a complementary bit line BLB. A control terminal of the second access unit 416 is likewise coupled to the word line WL.

The memory cell furthermore includes a pair of cross-coupled inverters. The first inverter 418 of the pair of cross-coupled inverters includes a pull-up transistor 424 and a pull-down transistor 428. A switching path of the pull-up transistor 424 is connected between a first virtual supply line VIRTVDD and the first data node 404, and a gate of the pull-up transistor 424 is coupled to the second data node 412. A switching path of the pull-down transistor 428 is connected between a second virtual supply line VIRTVSS and the first data node 404, and a gate of the pull-down transistor 428 is likewise coupled to the second data node 412. The second inverter 430 of the pair of cross-coupled inverters includes a pull-up transistor 432 and a pull-down transistor 434. A switching path of the pull-up transistor 432 is connected between the first virtual supply line VIRTVDD and the second data node 412, and a gate of the pull-up transistor 432 is coupled to the first data node 404. A switching path of the pull-down transistor 434 is connected between the second virtual supply line VIRTVSS and the second data node 412 and a gate of the pull-down transistor 434 is likewise coupled to the first data node 404.

The memory device 400 furthermore includes a first supply line VDD, a first bias circuit 440, a second supply line VSS and a second bias circuit 442. In one embodiment, during operation a positive supply potential is present on the first supply line VDD and a negative supply potential or a ground potential is present on the second supply line VSS. The first bias circuit 440 is coupled to the first virtual supply line VIRTVDD and to the first supply line VDD. The second bias circuit 442 is coupled to the second virtual supply line VIRTVSS and to the second supply line VSS. The first virtual supply line VIRTVDD has a parasitic capacitance Cvirtvdd and the second virtual supply line VIRTVSS likewise has a parasitic capacitance Cvirtvss.

The first bias circuit 440 includes a first PMOS transistor 444 and a second PMOS transistor 446. A first terminal of the first PMOS transistor 444 is coupled to the first supply line VDD. A second terminal and a control terminal of the first PMOS transistor 444 are coupled to the first virtual supply line VIRTVDD, such that the first PMOS transistor 444 is connected as a diode. By means of the first PMOS transistor 444 the voltage potential present on the first virtual supply line VIRTVDD is regulated to a specific value and the voltage potential present on the first virtual supply line VIRTVDD is prevented from falling below a specific voltage. In this case, the diode is dimensioned in such a way that a maximum leakage current saving is achieved in conjunction with reduced, but still acceptable data protection.

A first terminal of the second PMOS transistor 446 of the first bias circuit 440 is coupled to the first supply line VDD and a second terminal of the second PMOS transistor 446 is coupled to the first virtual supply line VIRTVDD. A control terminal of the second PMOS transistor 446 is coupled to a control signal VIRTVDD_ENB. Depending on the control signal VIRTVDD_ENB the first supply line VDD is connected to the first virtual supply line VIRTVDD via the second PMOS transistor 446, such that a voltage potential present on the first virtual supply line VIRTVDD corresponds to a voltage potential present on the first supply line VDD.

The second bias circuit 442 includes a first NMOS transistor 448 and a second NMOS transistor 450. A first terminal and a control terminal of the first NMOS transistor 448 are coupled to the second virtual supply line VIRTVSS, such that the first NMOS transistor 448 is connected as a diode. A second terminal of the first NMOS transistor 448 is coupled to the first supply line VSS. By means of the first NMOS transistor 448 the voltage potential present on the second virtual supply line VIRTVSS is regulated to a specific value and the voltage potential present on the second virtual supply line VIRTVSS is prevented from rising above a specific voltage. In this case, the diode is dimensioned in such a way that a maximum leakage current saving is achieved in conjunction with reduced, but still acceptable data protection.

A first terminal of the second NMOS transistor 450 of the second bias circuit 442 is coupled to the second supply line VSS and a second terminal of the second NMOS transistor 450 is coupled to the second virtual supply line VIRTVSS. A control terminal of the second NMOS transistor 450 is coupled to a control signal VIRTVSS_EN. Depending on the control signal VIRTVSS_EN the second supply line VSS is connected to the second virtual supply line VIRTVSS via the second NMOS transistor 450, such that a voltage potential present on the second virtual supply line VIRTVSS corresponds to a voltage potential present on the second supply line VSS.

Via the first and respectively second bias circuits 440, 442, a coupling between the first and respectively second supply line VDD, VSS and the first and respectively second virtual supply line VIRTVDD, VIRTVSS takes place. The coupling via the bias circuits 440, 442 has the effect that on the virtual supply line VIRTVDD, VIRTVSS a voltage potential is present which is derived from the voltage potential present on the corresponding supply line VDD, VSS. In this case, the voltage potential present on the virtual supply line VIRTVDD, VIRTVSS differs at times from the voltage potential present on the corresponding supply line VDD, VSS.

The memory device 400 furthermore includes a first precharge circuit 452 and a second precharge circuit 454. Both the first precharge circuit 452 and the second precharge circuit 454 are coupled to the first virtual supply line VIRTVDD and to the first supply line VDD. The first precharge circuit 452 is furthermore coupled to the bit line BL and the second precharge circuit 454 is furthermore coupled to the complementary bit line BLB. The bit line BL has a parasitic bit line capacitance Cbl and the complementary bit line BLB has a parasitic complementary bit line capacitance Cblb.

The first precharge circuit 452 includes a first PMOS transistor 456 and a second PMOS transistor 458. A first terminal of the first PMOS transistor 456 is coupled to the first supply line VDD, a second terminal of the first PMOS transistor 456 is coupled to the bit line BL and a control terminal of the first PMOS transistor 456 is coupled to a first control signal PRCHB0. A first terminal of the second PMOS transistor 458 is coupled to the first virtual supply line VIRTVDD, a second terminal of the second PMOS transistor 458 is coupled to the bit line BL and a control terminal of the second PMOS transistor 458 is coupled to a second control signal PRCHB1.

The second precharge circuit 454 likewise includes a first PMOS transistor 460 and a second PMOS transistor 462. The interconnection of the first PMOS transistor 460 of the second precharge circuit 454 corresponds to the interconnection of the first PMOS transistor 456 of the first precharge circuit 452, wherein a second terminal of the first PMOS transistor 460 of the second precharge circuit 454 is coupled to the complementary bit line BLB. The interconnection of the second PMOS transistor 462 of the second precharge circuit 454 corresponds to the interconnection of the second PMOS transistor 458 of the first precharge circuit 452, wherein a second terminal of the second PMOS transistor 462 of the second precharge circuit 454 is coupled to the complementary bit line BLB.

Before and/or after each active access to the memory cell of the memory device 400, the complementary bit line pair BL, BLB is precharged in order to enable potential reading from the memory cell as rapidly as possible. This precharging of the bit line BLB and of the complementary bit line BLB is effected via the first and second precharge circuits 452, 454.

The embodiments of the first bias circuit 440, of the second bias circuit 442, of the first precharge circuit 452 and of the second precharge circuit 454 as illustrated and described with reference to FIG. 4 are merely examples. In various embodiments, the first bias circuit 440, the second bias circuit 442, the first precharge circuit 452 and the second precharge circuit 454 can be embodied with different types of transistors or with a different interconnection of transistors.

In one embodiment, the memory device 400 includes further circuits and circuit blocks, such as amplifier circuits or decoder circuits, for example, which are not illustrated in FIG. 4 for reasons of clarity.

FIG. 5 shows a signal timing diagram showing exemplary operations of the memory device 400 illustrated and described in connection with FIG. 4. The functional dependencies of the signals illustrated or the temporal sequence of the events illustrated is clarified in part by arrows. The signal timing diagram 500 shows a clock signal CLK, a read signal RD and a write signal WR. The signal timing diagram furthermore shows the control signal VIRTVSS_EN, illustrated and described with reference to FIG. 4, the signal of the second virtual supply line VIRTVSS, the control signal VIRTVDD_ENB, the signal of the first virtual supply line VIRTVDD, the first control signal PRCHB0, the second control signal PRCHB1, the signal of the word line WL and the signal of the bit line BL. The signal of the complementary bit line BLB is not illustrated for reasons of clarity.

The clock signal CLK, the read signal RD and the write signal WR are fed to the memory device 400 from outside, for example. The control signal VIRTVSS_EN, the signal of the second virtual supply line VIRTVSS, the control signal VIRTVDD_ENB, the signal of the first virtual supply line VIRTVDD, the first control signal PRCHB0, the second control signal PRCHB1, the signal of the word line WL and the signal of the bit line BL are generated for example within the memory device 400 in a control circuit, not illustrated in FIG. 4. In one embodiment, the signals are generated within the control circuit depending on the clock signal CLK, the read signal RD and the write signal WR. In various embodiments, the signals are generated within the control circuit depending on additional or other signals. In various embodiments, the signals are generated outside the memory device 400.

The voltage levels of the signals of the signal timing diagram 500 are illustrated as a function of time, wherein time is shown along the x-axis and the voltage is shown along the y-axis. The clock signal CLK, the read signal RD, the write signal WR, the control signal VIRTVSS_EN, the control signal VIRTVDD_ENB, the first control signal PRCHB0, the second control signal PRCHB1 and the signal of the word line WL are digital signals corresponding either to the logic value "0" or to the logic value "1". The read signal RD, the write signal WR, the control signal VIRTVSS_EN and the signal of the word line WL are active if they correspond to the logic value "1", i.e. these signals are active high. The control signal VIRTVDD_ENBB, the first control signal PRCHB0 and the second control signal PRCHB1 are active if they correspond to the logic value "0", i.e. these signals are active low.

At the instant T1, the first data node 404 of the memory cell stores a logic value "0" and the complementary second data node 412 of the memory cell stores a logic value "1". The first control signal PRCHB0 is active and the bit line BL is precharged to the logic value "1" via the first PMOS transistor 456 of the first precharge circuit 452. The control signal VIRTVDD_ENB is likewise active and the first virtual supply line VIRTVDD is connected to the first supply line VDD via the second PMOS transistor 446 of the first bias circuit 440. A positive supply potential VDD corresponding to the voltage potential of the first supply line VDD is present on the first virtual supply line VIRTVDD. A positive potential that is not equal to zero is present on the second virtual supply line VIRTVSS. The read signal RD, the write signal WR, the control signal VIRTVSS_EN, the second control signal PRCHB1 and the word line WL are inactive.

At the instant T2, a read access to the memory cell begins and the memory device 400 is in an active mode. A rising edge of the clock signal CLK in conjunction with an activation of the read signal RD brings about an activation of the control signal VIRTVSS_EN and the second virtual supply line VIRTVSS is connected to the second supply line VSS via the second NMOS transistor 450 of the second bias circuit 442. The voltage potential present on the second virtual supply line VIRTVSS thus corresponds to the ground potential VSS present on the second supply line VSS. By virtue of the fact that the positive voltage potential VDD is present on the first virtual supply line VIRTVDD and the ground potential VSS is present on the second virtual supply line VIRTVSS reliable and secure reading from the memory cell is ensured. After a specific time, the control signal VIRTVSS_EN is deactivated again. The rising edge of the clock signal CLK furthermore brings about a deactivation of the first control signal PRCHB0 and the bit line BL is no longer precharged to the logic value "1" via the first PMOS transistor 456 of the first precharge circuit 452. Temporally after the deactivation of the first control signal PRCHB0 the word line WL becomes active and the bit line BL is connected to the first data node 404 via the first access unit 408. The content of the first data node 404, namely the logic value "0", is thereupon read out onto the bit line BL and the bit line BL changes from the logic value "1" to the logic value "0".

At the instant T3, the bit line BL changes from the logic value "1" to the logic value "0", the parasitic bit line capacitance Cbl is discharged and the parasitic capacitance Cvirtvss of the second virtual supply line VIRTVSS is correspondingly charged. The shifting of the charge from the parasitic bit line capacitance Cbl to the parasitic capacitance Cvirtvss of the second virtual supply line VIRTVSS takes place via the first access unit 408. On account of the shifting of the charge, the voltage potential present on the second virtual supply line VIRTVSS increases by a second voltage magnitude V2.

The charge reversal of the charge from the parasitic bit line capacitance Cbl to the parasitic capacitance Cvirtvss of the second virtual supply line VIRTVSS takes place during or directly at the end of the read access to the memory cell of the memory device 400. The resultant increase in voltage on the second virtual supply line VIRTVSS brings about a reduction of the leakage current consumption of the transistors 428, 434, by virtue of the subthreshold currents of the transistors 428, 434 being reduced. The memory cell or the memory device 400 thus already has a reduced leakage current consumption directly after the read access.

At the instant T4, the first data node 404 stores a logic value "0" and the complementary second data node 412 stores a logic value "1". The state of the memory cell at the instant T4 substantially corresponds to the state of the memory cell that was described further above for the instant T1.

At the instant T5, a write access to the memory cell begins and the memory device 400 is in an active mode. A rising edge of the clock signal CLK in conjunction with an activation of the write signal WR brings about an activation of the control signal VIRTVSS_EN and the second virtual supply line VIRTVSS is connected to the second supply line VSS via the second NMOS transistor 450 of the second bias circuit 442. During the write access, the voltage potential present on the second virtual supply line VIRTVSS thus corresponds to the ground potential VSS present on the second supply line VSS. By virtue of the fact that the positive voltage potential VDD is present on the first virtual supply line VIRTVDD and the ground potential VSS is present on the second virtual supply line VIRTVSS, reliable and secure writing to the memory cell is ensured. Furthermore, the control signal VIRTVDD_ENB is deactivated and the first virtual supply line VIRTVDD is no longer connected to the first supply line VDD via the second PMOS transistor 446 of the first bias circuit 440. Moreover, the first control signal PRCHB0 is deactivated and the bit line BL is no longer precharged to the logic value "1" via the first PMOS transistor 456 of the first precharge circuit 452. Temporally after the deactivation of the first control signal PRCHB0 the word line WL becomes active and the bit line BL is connected to the first data node 404 via the first access unit 408. The logic value "0" present on the bit line BL is written to the first data node 404. The first data node 404 retains its logic value "0" during this write access.

Temporally after a deactivation of the word line WL at the end or after the conclusion of the write access, at the instant T6, an activation of the second control signal PRCHB1 takes place and the bit line BL is connected to the first virtual supply line VIRTVDD via the second PMOS transistor 458 of the first precharge circuit 452. A discharging of the parasitic capacitance Cvirtvdd of the first virtual supply line VIRTVDD and a corresponding charging of the parasitic bit line capacitance Cbl take place. The shifting of the charge from the parasitic capacitance Cvirtvdd of the first virtual supply line VIRTVDD to the parasitic bit line capacitance Cbl takes place via the second PMOS transistor 458 of the first precharge circuit 452. On account of the shifting of the charge, the voltage potential present on the first virtual supply line VIRTVDD decreases by a first voltage magnitude V1. The voltage potential present on the bit line BL is correspondingly increased.

The charge reversal of the charge from the parasitic capacitance Cvirtvdd of the first virtual supply line VIRTVDD to the parasitic bit line capacitance Cbl takes place directly at the end of or after the write access to the memory cell of the memory device 400. The resultant decrease in voltage on the first virtual supply line VIRTVDD brings about a reduction of the leakage current consumption of the transistors 424, 432, by virtue of the subthreshold currents of the transistors 424, 432 being reduced. The memory cell or the memory device 400 thus has a reduced leakage current consumption directly after the write access.

After the shifting of the charge from the parasitic capacitance Cvirtvdd of the first virtual supply line VIRTVDD to the parasitic bit line capacitance Cbl has been concluded, a deactivation of the second control signal PRCHB1 takes place and the bit line BL is no longer connected to the first virtual supply line VIRTVDD. Temporally afterward, the first control signal PRCHB0 is also activated. This activation of the first control signal PRCHB0 brings about a further increase in the voltage potential present on the bit line BL by virtue of the bit line BL being precharged to the logic value "1" via the first PMOS transistor 456 of the first precharge circuit 452. In various embodiments, the first control signal PRCHB0 is activated only at a later instant, for example before a renewed read access takes place.

The second voltage magnitude V2, by which the voltage potential present on the second virtual supply line VIRTVSS increases during the read access, and the first voltage magnitude V1, by which the voltage potential present on the first virtual supply line VIRTVDD decreases during the read access, arise inter alia from the size ratio of the parasitic bit line capacitance Cbl to the parasitic capacitance Cvirtvss of the second virtual supply line VIRTVSS and respectively from the size ratio of the parasitic bit line capacitance Cbl to the parasitic capacitance Cvirtvdd of the first virtual supply line VIRTVDD. In various embodiments, a memory device includes a multiplicity of memory cells and the parasitic capacitance Cvirtvss of the second virtual supply line VIRTVSS and respectively the parasitic capacitance Cvirtvdd of the first virtual supply line VIRTVDD are greater than the parasitic bit line capacitance Cbl.

The signal timing diagram illustrated and described with reference to FIG. 5 shows as operations, i.e. as active accesses to the memory cell, a read operation followed by a write operation. During the read operation, a logic value "0" is read out from the first data node 404 of the memory cell and a logic value "1" is read out from the complementary second data node 412 of the memory cell. During the subsequent write operation, a logic value "0" is written to the first data node 404 of the memory cell and a logic value "1" is written to the complementary second data node 412 of the memory cell. During the read operation and during the write operation, a charge reversal takes place between the parasitic capacitance Cvirtvss of the second virtual supply line VIRTVSS and respectively the parasitic capacitance Cvirtvdd of the first virtual supply line VIRTVDD and the parasitic bit line capacitance Cbl. During a read or write operation that is not illustrated in FIG. 5, a logic value "1" is stored in the first data node 404 of the memory cell and a logic value "0" is stored in the complementary second data node 412 of the memory cell. During this read or write operation, a charge reversal takes place between the parasitic capacitance Cvirtvss of the second virtual supply line VIRTVSS and respectively the parasitic capacitance Cvirtvdd of the first virtual supply line VIRTVDD and the parasitic complementary bit line capacitance Cblb. This charge reversal takes place analogously to the read and write operation illustrated and described with reference to FIG. 5.

As already described further above with reference to the signal timing diagram illustrated and described in FIG. 5, a reduced leakage current consumption or a reduced power loss of the memory cell occurs directly at the end of or after the read access and the write access by virtue of the voltage on the second virtual supply line VIRTVSS being increased or by virtue of the voltage on the first virtual supply line VIRTVDD being decreased. The reduced leakage current consumption brings about a low power consumption and a low energy requirement of the memory cell and of the memory device. In this case, the second voltage magnitude V2, by which the voltage potential present on the second virtual supply line VIRTVSS increases, and the first voltage magnitude V1, by which the voltage potential present on the first virtual supply line VIRTVDD decreases, are designed in such a way that a content of the memory cell is securely maintained including in the inactive mode. The memory cell is robust and operates reliably even in the presence of disturbances.

FIG. 6 shows a signal timing diagram showing exemplary operations of a memory device derived from the memory device 400 illustrated and described in connection with FIG. 4. In contrast to the memory device 400, the derived memory device has no second bias circuit 442 and no second virtual supply line VIRTVSS. Consequently, a terminal of the pull-down transistor 428 of the first inverter 418 is directly coupled to the second supply line, VSS. Moreover, a terminal of the pull-down transistor 434 of the second inverter 430 is likewise directly coupled to the second supply line VSS. In contrast to the signal timing diagram 500 illustrated and described with reference to FIG. 5, the signal timing diagram 600 illustrated in FIG. 6 does not contain the control signal VIRTVSS_EN, nor the signal of the second virtual supply line VIRTVSS. The function of the other signals illustrated in FIG. 6 corresponds to the function of the respective signals illustrated in FIG. 5.

The signal timing diagram illustrated in FIG. 6 shows two active accesses to the memory cell, namely a read access followed by a write access. At the instant T1, i.e. before the read access, and at the instant T4, i.e. between the read access and the write access, the first data node 404 of the memory cell stores a logic value "0" and the complementary second data node 412 of the memory cell stores a logic value "1". The first control signal PRCHB0 is active and the bit line BL is precharged to the logic value "1" via the first PMOS transistor 456 of the first precharge circuit 452. The control signal VIRTVDD_ENB is inactive and a positive voltage potential lying below the positive supply potential VDD is present on the first virtual supply line VIRTVDD. The memory cell or the memory device is consequently in a state with reduced leakage current consumption.

At the instant T2, a read access to the memory cell begins and the memory device is in an active mode. A rising edge of the clock signal CLK in conjunction with an activation of the read signal RD brings about an activation of the control signal VIRTVDD_ENB and the first virtual supply line VIRTVDD is connected to the first supply line VDD via the second PMOS transistor 446 of the first bias circuit 440. Secure reading from the memory cell is ensured as a result. There follows a deactivation of the first control signal PRCHB0 and the bit line BL is no longer precharged to the logic value "1" via the first PMOS transistor 456 of the first precharge circuit 452. Temporally after the deactivation of the first control signal PRCHB0 the word line WL becomes active and the bit line BL is connected to the first data node 404 via the first access unit 408. The content of the first data node 404, namely the logic value "0", is thereupon read out onto the bit line BL and the bit line BL changes from the logic value "1" to the logic value "0". Furthermore, the control signal VIRTVDD_ENB is deactivated and the first virtual supply line VIRTVDD is no longer connected to the first supply line VDD via the second PMOS transistor 446 of the first bias circuit 440.

Temporally after a deactivation of the word line WL at the end or after the conclusion of the read access, at the instant T3 an activation of the second control signal PRCHB1 takes place and the bit line BL is connected to the first virtual supply line VIRTVDD via the second PMOS transistor 458 of the first precharge circuit 452. A discharging of the parasitic capacitance Cvirtvdd of the first virtual supply line VIRTVDD and a corresponding charging of the parasitic bit line capacitance Cbl take place. The shifting of the charge from the parasitic capacitance Cvirtvdd of the first virtual supply line VIRTVDD to the parasitic bit line capacitance Cbl takes place via the second PMOS transistor 458 of the first precharge circuit 452. On account of the shifting of the charge, the voltage potential present on the first virtual supply line VIRTVDD decreases by a first voltage magnitude V1. The voltage potential present on the bit line BL is correspondingly increased.

The charge reversal of the charge from the parasitic capacitance Cvirtvdd of the first virtual supply line VIRTVDD to the parasitic bit line capacitance Cbl takes place directly at the end of or after the read access to the memory cell of the derived memory device. The resultant decrease in voltage on the first virtual supply line VIRTVDD brings about a reduction of the leakage current consumption of the transistors, as already described further above with reference to the write access illustrated in FIG. 5. The memory cell or the derived memory device thus has a reduced leakage current consumption directly after the read access.

After the shifting of the charge from the parasitic capacitance Cvirtvdd of the first virtual supply line VIRTVDD to the parasitic bit line capacitance Cbl has been concluded, a deactivation of the second control signal PRCHB1 takes place and the bit line BL is no longer connected to the first virtual supply line VIRTVDD. Temporally afterward, the first control signal PRCHB0 is also activated. This activation of the first control signal PRCHB0 brings about a further increase in the voltage potential present on the bit line BL by virtue of the bit line BL being precharged to the logic value "1" via the first PMOS transistor 456 of the first precharge circuit 452. In a manner similar to that as already described further above with reference to the write access illustrated in FIG. 5, the charging of the bit line BL takes place in two stages, wherein the activation of the first control signal PRCHB0 can also take place at a later instant.

At the instant T5, a write access to the memory cell begins and the derived memory device is in an active mode. During the write access, the logic value "0" present on the bit line BL is written to the first data node 404. The first data node 404 thus maintains its logic value "0" during this write access. A rising edge of the clock signal CLK in conjunction with an activation of the write signal WR brings about an activation of the control signal VIRTVDD_ENB and the first virtual supply line VIRTVDD is connected to the first supply line VDD via the second PMOS transistor 446 of the first bias circuit 440 in order to ensure secure writing to the memory cell. The subsequent deactivation of the first control signal PRCHB0, activation of the word line WL, deactivation of the control signal VIRTVDD_ENB and deactivation of the word line WL proceed in a similar manner to the read access described further above with reference to FIG. 6.

At the instant T6, after the conclusion of the write access, the bit line BL is charged in two stages, in a manner similar to that already described further above with reference to the write access illustrated in FIG. 5 and with reference to the read access illustrated in FIG. 6.

In one embodiment (not illustrated), a memory device includes a multiplicity of memory cells such as have been illustrated and described by way of example with reference to FIG. 1-FIG. 6. The multiplicity of memory cells are arranged within a memory cell array in columns and rows. The memory cells of a column are in each case coupled to an identical bit line and to an identical complementary bit line. The memory cells of a row are in each case coupled to an identical word line. In one embodiment, all the memory cells of the memory cell array are coupled to an identical first virtual supply line. In various embodiments, all the memory cells are additionally coupled to an identical second virtual supply line. Consequently, all the memory cells of the multiplicity of memory cells are coupled to the first and respectively second virtual supply line. In contrast thereto, only a portion of the memory cells of the multiplicity of memory cells are coupled to an identical bit line and to an identical complementary bit line. A parasitic capacitance of the first and respectively second virtual supply line is thus greater than a parasitic bit line capacitance and a parasitic complementary bit line capacitance. As already mentioned with reference to FIG. 5, the size ratio of the parasitic capacitances has an influence on the voltage potentials present on the first and respectively on the second virtual supply line directly after an active access.

A memory device illustrated and described with reference to FIG. 1-FIG. 6 is used within a system in a multiplicity of fields, such as, for example, the entertainment industry, the computer industry, the automotive industry or in the fields of industry and telecommunications.

FIG. 7 shows a flow chart of a method. The method 700 is suitable for putting a memory cell into a state with a reduced leakage current consumption. The order of the steps of the method 700 need not correspond to the order described below. The method 700 can be carried out by means of a memory device as described in the previous sections.

In 702, an active access to the memory cell is started. In one embodiment, the active access is a write access. In various embodiments, the active access is a read access.

In 704, a charge is stored within a memory device. The memory device includes the memory cell.

In 706, the active access to the memory cell is ended.

In 708, the charge is re-stored. In one embodiment, re-storing the charge includes re-storing parasitic capacitances. The parasitic capacitances are part of the memory device. In one embodiment, re-storing the charge includes charging or discharging a parasitic bit line capacitance of a bit line. The bit line is coupled to the memory cell.

In 710, a voltage potential present on a virtual supply line is altered. The virtual supply line is coupled to the memory cell. In one embodiment, altering the voltage potential present on the virtual supply line includes charging or discharging a parasitic capacitance of the virtual supply line.

In one embodiment of the method, the active access is a write access or a read access, and storing the charge includes storing the charge in the parasitic capacitance of the virtual supply line. Re-storing the charge includes charging the parasitic bit line capacitance and altering the voltage potential present on the virtual supply line includes decreasing by a first voltage magnitude. This embodiment of the method is illustrated and described for example in the signal timing diagram illustrated with reference to FIG. 6.

In a further embodiment of the method, the active access is a read access, and storing the charge includes storing the charge in the parasitic bit line capacitance. Re-storing the charge includes charging the parasitic capacitance of the virtual supply line, and altering the voltage potential present on the virtual supply line includes increasing by a second voltage magnitude. This embodiment of the method is described for example with reference to the read access illustrated in the signal timing diagram in FIG. 5.

In one development of the method, a write access to the memory cell is started. A further charge is stored in a further parasitic capacitance of a further virtual supply line. The write access to the memory cell is ended and the further charge is re-stored. Re-storing the further charge includes charging the parasitic bit line capacitance. A voltage potential present on the further virtual supply line is decreased by a first voltage magnitude. This embodiment of the method is described for example with reference to the write access illustrated in the signal timing diagram in FIG. 5.

While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A memory device, comprising:
   at least one memory cell and at least one virtual supply line coupled to the at least one memory cell;
   wherein the memory device is designed in such a way that a voltage potential present on the virtual supply line is altered after an active access to the memory cell by virtue of a charge stored within the memory device during the active access being re-stored in such a way that a state of the memory cell with a reduced leakage current consumption is achieved.

2. The memory device of claim 1,
   wherein the active access is a write access or a read access.

3. The memory device of claim 1,
   wherein re-storing the charge comprises re-storing parasitic capacitances within the memory device.

4. The memory device of claim 1,
   wherein the voltage potential present on the virtual supply line is altered by virtue of a parasitic capacitance of the virtual supply line being charged or discharged.

5. The memory device of claim 4, further comprising:
   at least one bit line coupled to the at least one memory cell;
   wherein re-storing the charge comprises charging or discharging a parasitic bit line capacitance of the at least one bit line.

6. The memory device of claim 5,
   wherein the active access is a write access or a read access; and
   wherein the voltage potential present on the virtual supply line is decreased by a first voltage magnitude after the write access or the read access by virtue of the parasitic bit line capacitance being charged by a charge stored in the parasitic capacitance of the virtual supply line during the write access or the read access.

7. The memory device of claim 6,
   wherein the voltage potential present on the virtual supply line comprises a positive supply potential.

8. The memory device of claim 5,
   wherein the active access is a read access; and
   wherein the voltage potential present on the virtual supply line is increased by a second voltage magnitude after the read access by virtue of the parasitic capacitance of the virtual supply line being charged by a charge stored in the parasitic bit line capacitance during the read access.

9. The memory device of claim 8,
   wherein the voltage potential present on the virtual supply line comprises a ground potential.

10. The memory device of claim 5,
    wherein the at least one virtual supply line comprises a first virtual supply line and a second virtual supply line.

11. The memory device of claim 10,
    wherein the active access is a write access, and wherein the voltage potential present on the first virtual supply line is decreased by a first voltage magnitude after the write access by virtue of the parasitic bit line capacitance being charged by a charge stored in a parasitic capacitance of the first virtual supply line during the write access.

12. The memory device of claim 10,
    wherein the active access is a read access; and
    wherein the voltage potential present on the second virtual supply line is increased by a second voltage magnitude after the read access by virtue of a parasitic capacitance of the second virtual supply line being charged by a charge stored in the parasitic bit line capacitance during the read access.

13. The memory device of claim 1, further comprising:
    at least one supply line; and
    at least one bias circuit coupled to the virtual supply line and to the supply line in order, during the active access, to match a voltage potential present on the virtual supply line to a voltage potential present on the supply line.

* * * * *